(12) United States Patent
Miura et al.

(10) Patent No.: US 7,992,976 B2
(45) Date of Patent: Aug. 9, 2011

(54) DROPLET DISCHARGING DEVICE AND METHOD FOR HEATING FUNCTIONAL LIQUID THEREOF

(75) Inventors: Hirotsuna Miura, Fujimi-machi (JP); Toshiyuki Kobayashi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 956 days.

(21) Appl. No.: 11/925,627

(22) Filed: Oct. 26, 2007

(65) Prior Publication Data

US 2009/0174751 A1   Jul. 9, 2009

(30) Foreign Application Priority Data

Oct. 27, 2006   (JP) ................................. 2006-292192
Oct. 30, 2006   (JP) ................................. 2006-293638
Jul. 20, 2007   (JP) ................................. 2007-189152

(51) Int. Cl.
*B41J 2/175*   (2006.01)
*B41J 29/377*   (2006.01)

(52) U.S. Cl. .............................. 347/85; 347/18; 347/21

(58) Field of Classification Search .............. 347/17–18, 347/21
See application file for complete search history.

(56) References Cited

U.S. PATENT DOCUMENTS 7,448,736 B2 *   11/2008   Hong et al. ..................... 347/85
7,500,745 B2 *   3/2009   Ushirogouchi et al. ...... 347/102

FOREIGN PATENT DOCUMENTS

JP   2000-238281   9/2000
JP   2005-305973   11/2005

* cited by examiner

*Primary Examiner* — Jerry T Rahll
(74) *Attorney, Agent, or Firm* — Workman Nydegger

(57) ABSTRACT

A method is for heating a functional liquid of a droplet discharging device that has a storage which houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head. The method includes: heating the functional liquid in the supply tube with waste heat that is generated correspondingly to cooling of the cooling means.

5 Claims, 8 Drawing Sheets

DROPLET DISCHARGING DEVICE AND METHOD FOR HEATING FUNCTIONAL LIQUID THEREOF

BACKGROUND

1. Technical Field

The present invention relates to a droplet discharging device and a method for heating a functional liquid of a droplet discharging device.

2. Related Art

Ink-jet devices that discharge a functional liquid in droplets, namely droplet discharging devices have drawn attention as a device for forming a desired pattern on a substrate. The droplet discharging devices move a substrate placed on a stage thereof two-dimensionally relative to a droplet discharge head that discharges the functional liquid in droplets so as to dispose the droplets discharged from the droplet discharge head on predetermined positions of a surface of the substrate, forming a pattern.

In the droplet discharging devices, if the viscosity of the functional liquid is unstable, the droplet weight changes, causing variation of the pattern in size or in shape. Further, when the viscosity of the functional liquid is high, a nozzle of the droplet discharge head is clogged, causing a droplet-discharging defect. Therefore, the droplet discharging devices cool the functional liquid that is to be supplied to the droplet discharge head by a cooling means or heat it by a heating means so as to control the viscosity of the functional liquid, as disclosed in JP-A-2000-238281 and JP-A-2005-305973, for example.

A method for forming a wiring pattern on a substrate irradiates the droplet with a laser beam for high accuracy of wiring width, that is, high accuracy of a diameter of the droplet. The discharged droplet is irradiated with the laser beam to be dried in a short time, being able to prevent the droplet from spreading after it lands. As the functional liquid for forming such wiring pattern, a dispersion-based metal ink obtained by dispersing metal particulates of silver (Ag), for example, in a solvent is known.

When the metal ink mentioned above is left at a room temperature, a secondary aggregation or the like occurs in the ink, deteriorating the ink. In a case where the droplet discharging devices are driven continuously for a long time, the metal ink stored in a tank is kept to be at the room temperature to deteriorate. Thus a stable operation is difficult. Therefore, in a case where the metal ink is used, it is necessary that the tank is cooled by the cooling means so as to cool the ink.

On the other hand, if the metal ink that is stored in the tank is cooled down, the metal ink at a low temperature is supplied from the tank to the droplet discharge head. As a result, it is difficult for the droplet discharge head to discharge the ink in droplets because the metal ink is at a low temperature, that is, has high viscosity. This problem can be solved such that the heating means is provided to a supply tube that couples the tank and the droplet discharge head so as to heat the metal ink flowing in the supply tube. Thus the metal ink that is not used is cooled by the cooling means so as to be prevented from deteriorating and the metal ink that is in use is heated by the heating means so as to decrease the viscosity thereof.

However, the above structure includes the heating means and the cooling means separately, increasing power consumption and causing a larger size of the droplet discharging device.

SUMMARY

An advantage of the present invention is to provide a droplet discharging device and a method for heating a functional liquid of a droplet discharging device that can favorably control a temperature of the functional liquid that is to be supplied to a droplet discharge head while saving energy.

According to a first aspect of the invention, a method is to heat a functional liquid of a droplet discharging device having: a storage that houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head. The method includes: heating the functional liquid in the supply tube with waste heat that is generated correspondingly to cooling of the cooling means.

According to the method of the first aspect, the functional liquid in the supply tube is heated by the waste heat generated correspondingly to the cooling of the cooling means, and then supplied to the droplet discharge head. Thus, in the method of the first aspect, the functional liquid that is cooled can be heated without using a heating means for merely heating a functional liquid, being able to achieve energy-saving.

According to a second aspect of the invention, a method is to heat a functional liquid of a droplet discharging device having: a storage that houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head. The method includes: heating the functional liquid in the supply tube by heat exchange between the functional liquid in the supply tube; and surrounding air and assisting the cooling means in cooling with the air that is cooled by the heat exchange.

According to the method of the second aspect, the surrounding air heats the functional liquid in the supply tube by the heat exchange with the functional liquid in the supply tube. In addition, the air that is cooled by the heat exchange with the functional liquid assists the cooling means in cooling. Thus, in the method of the second aspect, the functional liquid that is cooled can be heated without using a heating means for merely heating a functional liquid and the cooling effect of the cooling means can be improved, being able to achieve energy-saving.

According to a third aspect of the invention, a method is to heat a functional liquid of a droplet discharging device having: a storage that houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head. The method includes: heating the functional liquid in the supply tube with waste heat that is generated correspondingly to irradiation of the light source.

According to the method of the third aspect, the functional liquid that is cooled in the supply tube is heated with the waste heat of the light source, and then supplied to the droplet discharge head. Thus, in the method of the third aspect, the functional liquid that is cooled can be heated without using a heating means for merely heating a functional liquid, being able to achieve energy-saving.

According to a fourth aspect of the invention, a method is to heat a functional liquid of a droplet discharging device having: a storage that houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head. The method includes: heating the functional liquid in the supply tube by heat exchange between the functional liquid in the supply tube and a refrigerant in the light source; and assisting in cooling the light source with the refrigerant that is cooled by the heat exchange.

According to the method of the fourth aspect, the refrigerant in the light source heats the functional liquid in the supply tube by the heat exchange with the functional liquid in the supply tube. In addition, the refrigerant that is cooled by the heat exchange with the functional liquid assists in cooling the light source. Thus, in the method of the fourth aspect, the functional liquid that is cooled can be heated without using a heating means for merely heating a functional liquid and the cooling effect of the cooling means can be improved, being able to achieve energy-saving.

A droplet discharging device according to a fifth aspect of the invention includes: a storage that houses a container storing a functional liquid containing a functional material; a droplet discharge head discharging the functional liquid in a droplet; a cooling means cooling the functional liquid that is stored in the container housed in the storage; a supply tube provided between the container and the droplet discharge head and supplying the functional liquid stored in the container to the droplet discharge head; and a heating means heating the supply tube with waste heat that is generated correspondingly to cooling of the cooling means.

According to the droplet discharge device of the fifth aspect, the waste heat generated correspondingly to the cooling of the cooling means heats the functional liquid in the supply tube. Thus, in the device of the aspect, the functional liquid that is cooled can be heated without using a heating means for merely heating a functional liquid, being able to achieve energy-saving.

In the droplet discharging device of the aspect, the cooling means and the heating means may be a Peltier element of which a cooling part is thermally brought into contact with the storage so as to cool the functional liquid stored in the container and a heat generating part is thermally brought into contact with the supply tube so as to heat the supply tube.

According to the device of the aspect, one Peltier element can achieve cooling the functional liquid in the storage and heating the functional liquid flowing in the supply tube. Thus the droplet discharge device uses the heat given from the Peltier element effectively. Therefore, the droplet discharge device does not need to be provided with a cooling means for cooling a functional liquid and a heating means for heating a functional liquid separately, being able to reduce the number of components thereof and achieve natural resource saving, namely be friendly to the environment.

The droplet discharging device of the aspect further includes a blowing means provided between the heat generating part and the supply tube and blowing surrounding air to the heat generating part via the supply tube.

According to the device of the aspect, the blowing means promotes the heat exchange between the surrounding air and the functional liquid in the supply tube so as to heat the functional liquid that is cooled. In addition, the blowing means blows the air that is cooled by the heat exchange with the functional liquid to the heat generating part of the Peltier element. This blowing cools the heat generating part, so that the Peltier element can improve the cooling effect of the cooling part thereof.

In the droplet discharging device of the aspect, the cooling means and the heating means may be a heat pump of which a cooling part is thermally brought into contact with the storage so as to cool the functional liquid stored in the container and a heat generating part is thermally brought into contact with the supply tube so as to heat the supply tube.

According to the device of the aspect, the heat pump cools the functional liquid that is in the storage and heats the functional liquid that is in the supply tube. Thus the droplet discharge device uses the heat given from the heat pump effectively. Therefore, the droplet discharge device does not need to be provided with a cooling means for cooling a functional liquid and a heating means for heating a functional liquid separately, being able to reduce the number of components thereof and achieve natural resource saving, namely be friendly to the environment.

A droplet discharging device according to a sixth aspect of the invention includes: a storage that houses a container storing a functional liquid containing a functional material; a droplet discharge head discharging the functional liquid in a droplet to an object; a cooling means cooling the functional liquid that is stored in the container housed in the storage; a supply tube provided between the container and the droplet discharge head and supplying the functional liquid stored in the container to the droplet discharge head; a light source irradiating an area of the object on which the droplet lands with light; and a heating means heating the supply tube with waste heat that is generated by irradiation of the light source.

According to the device of the sixth aspect, the functional liquid that is to be supplied to the droplet discharge head is warmed with the waste heat of the light source. Thus the droplet discharging device does not need a heating means for merely heating a functional liquid, being able to achieve energy-saving and natural resource saving. Accordingly, the device being environmental-friendly can be provided.

In the device of the aspect, the heating means may include a circulation pump and a heat exchanger; the circulation pump may allow a refrigerant to circulate between a case of the light source and the heat exchanger; and the heat exchanger may provide heat of the case to the functional liquid that is in the supply tube by heat exchange between the refrigerant and the supply tube.

According to the device of the aspect, the refrigerant circulates through the case of the light source to be heated and is sent to the inside of the heat exchanger. The refrigerant that is sent to the heat exchanger is cooled by the heat exchange with the functional liquid that is supplied from the storage. Then the refrigerant that is cooled is sent to the case of the light source so as to cool the light source effectively. Thus the droplet discharging device does not need a heating means for merely heating a functional liquid and a cooling means for merely cooling a light source, being able to achieve energy-saving and natural resource saving. Accordingly, the device being environmental-friendly can be provided.

In the device of the aspect, the circulation pump may include a cooling mechanism and circulate the refrigerant that is cooled with the cooling mechanism to the case of the light source.

According to the device, the cooling mechanism of the circulation pump improves the cooling effect of the light source.

In the device of the aspect, the heating means may be a cooling fan that sucks external air to an inside of the case of the light source and blows inner air of the case to the supply tube that is provided outside of the case.

According to the device of the aspect, the functional liquid that is to be supplied to the droplet discharge head is warmed with the waste heat exhausted from the light source. Thus the device does not need a particular heating means, being able to achieve energy-saving and natural resource saving. Accordingly, the device being environmental-friendly can be provided.

A droplet discharging device according to a seventh aspect of the invention includes: a storage that houses a container storing a functional liquid containing a functional material; a droplet discharge head discharging the functional liquid in a droplet; a cooling means cooling the functional liquid that is stored in the container housed in the storage; a supply tube that is provided between the container and the droplet discharge head, supplies the functional liquid stored in the container to the droplet discharge head, is wound around outer periphery of the storage, and heats the functional liquid therein by heat exchange with surrounding air.

According to the device of the seventh aspect, the supply tube increases the distance from the container to the droplet discharge head, that is, a chance of the heat exchange between the functional liquid and the surrounding air. In addition, the supply tube allows the functional liquid to absorb the heat energy of the surrounding air of the storage, being able to improve the heat insulating effect in the storage and achieve energy-saving.

In the device of the aspect, the supply tube may be multiply-wound around the periphery of the storage such that an upstream side of the functional liquid is disposed at an inner winding and a downstream side of the functional liquid is disposed at an outer winding.

According to the droplet discharging device of the aspect, the functional liquid that is cooled goes around the inner winding and the functional liquid that is to be supplied to the droplet discharge head goes around the outer winding. Therefore, the droplet discharging device can further improve the heat insulating effect in the storage and achieve energy-saving.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

A droplet discharging device by which a wiring pattern is formed on a green sheet according to a first embodiment of the invention will now be described with reference to FIGS. 1 to 5.

Figure 1:
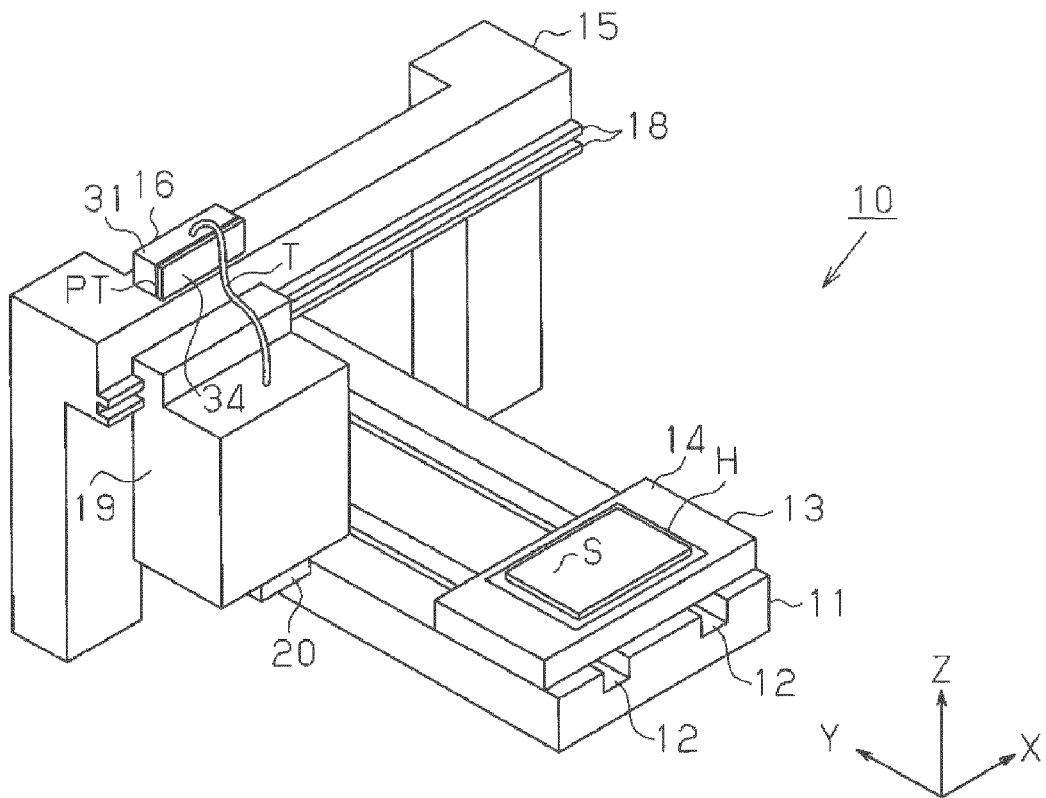
FIG. 1 is a whole perspective view showing a droplet discharging device according to a first embodiment of the invention.

FIG. 1 is a whole perspective view for explaining a droplet discharging device 10. This droplet discharging device 10 includes a rectangular parallelepiped base 11. On an upper surface of the base 11, a pair of guide grooves 12 extending in a longitudinal direction of the base 11 (hereinafter, referred to as merely "Y-arrow direction") is provided. Above the guide grooves 12, a stage 13 that moves in Y-arrow direction and reverse Y-arrow direction along the guide grooves 12 is provided. On an upper surface of the stage 13, a placing part 14 is formed. The placing part 14 places a low temperature firing substrate before fired (hereinafter, referred to as merely "green sheet S") thereon. The placing part 14 positions and fixes the green sheet S with respect to the stage 13 so as to convey the green sheet S in Y-arrow direction and reverse Y-arrow direction. On the upper surface of the stage 13, a rubber heater H is provided. The rubber heater H heats the whole upper surface of the green sheet S that is placed on the placing part 14 up to a predetermined temperature. In the embodiment, the green sheet S is the low temperature firing substrate having flexibility. The green sheet S is obtained such that powder of glass ceramic based material and a dispersion medium are mixed with a binder, a foam stabilizer, and the like so as to make slurry, and the slurry is shaped in plate and dried.

The base 11 is provided with a guiding member 15 having a shape of a gate and straddling the base 11 in a direction perpendicular to Y-arrow direction. On the guiding member 15, a pack storage 16 extending in X-arrow direction is provided. In the pack storage 16, an ink-pack 33 (see FIG. 4) as a container storing a meal ink F (see FIG. 2) as a functional liquid is housed. The metal ink F stored in the ink pack 33 is supplied through a supply tube T as a supply pipe connected with the ink pack 33 to a droplet discharge head (hereinafter, referred to as merely "discharge head") 20 at predetermined pressure. The metal ink F supplied to the discharge head 20 is discharged to the green sheet S as a droplet Fb (see FIG. 2).

The metal ink F can be a dispersion based metal ink obtained by dispersing metal particles as a functional material, such as metal particulates as a functional material having several nm diameter, in a solvent. The metal ink F exhibits its function (conductivity in the embodiment) when it is dried.

Examples of the metal particulates for the metal ink F includes gold (Au), silver (Ag), copper (Cu), aluminum (Al), palladium (Pd), manganese (Mn), titanium (Ti), tantalum (Ta), nickel (Ni), oxide products of these, and particulates of superconductor. The diameter of the metal particulates is preferably in the range from 1 nm to 0.1 μm. The metal particulates having more than 0.1 μm diameter sometimes clogs a nozzle N of the discharge head 20. While, particulates having less than 1 nm diameter sometimes make a volume ratio of the dispersing agent with respect to the metal particulates so large that the ratio of the organic matter in a film that is to be obtained becomes excessive.

Here, any dispersion medium that is capable of dispersing the above-described metal particulates and does not cause an aggregation can be used. Examples of the dispersion medium may include: aqueous solvents; alcohols such as methanol, ethanol, propanol, and butanol; hydro-carbon compounds such as n-heptane, n-octane, decane, dodecane, tetradecane, toluene, xylene, cymene, durene, indene, dipentene, tetrahydronaphthalene, decahydronaphthalene, and cyclohexylbenzene; polyols such as ethylene glycol, diethylene glycol, triethylene glycol, glycerin, and 1,3-propanediol; ether compounds such as polyethylene glycol, ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis (2-methoxyethyl) ether, and p-dioxane; and polar compounds such as propylene carbonate, gamma-butyrolactone, N-methyl-2-pyrrolidone, dimethylformamide, dimethyl sulfoxide, cyclohexanone, and ethyl lactate. Water, alcohols, hydro-carbon compounds, and ether compounds are preferably used in terms of particulate dispersibility, dispersion-liquid stability, and applicability to droplet discharge. Water and hydro-carbon compounds are used more preferably.

For example, such metal ink F can be used that is obtained by dispersing silver (Ag) particles in an aqueous solvent containing 40% of water (boiling point: 100° C.), 40% of ethylene glycol (boiling point: 198° C.), and 30% of polyethylene glycol #1000 (decomposition temperature: 168° C.). In addition, such metal ink F can also be used that is obtained by dispersing metal particulates (particles of Au, Ag, Ni, Mn, and the like) in a solvent containing tetradecane (boiling point: 253° C.).

When the droplet Fb of the metal ink F is heated, part of the solvent or the dispersion medium of the ink is evaporated from a surface of the droplet, increasing the viscosity of its exterior surface. Namely, solid content (particle) concentration at the periphery of the droplet Fb becomes saturated faster than that at the central part of the droplet, increasing the viscosity of the droplet from its exterior surface. The viscosity increases at the exterior surface of the droplet Fb, so that the droplet Fb of the metal ink F is prevented from spreading in a surface direction of the green sheet S, namely is subjected to pinning.

The guiding member 15 is provided with a pair of upper and lower guide rails 18 extending along X-arrow direction at approximate whole width of the guiding member 15. On the pair of upper and lower guide rails 18, a carriage 19 is attached. The carriage 19 moves in X-arrow direction and reverse X-arrow direction by being guided along the guide rails 18. The carriage 19 includes the droplet discharge head 20.

Figure 2:
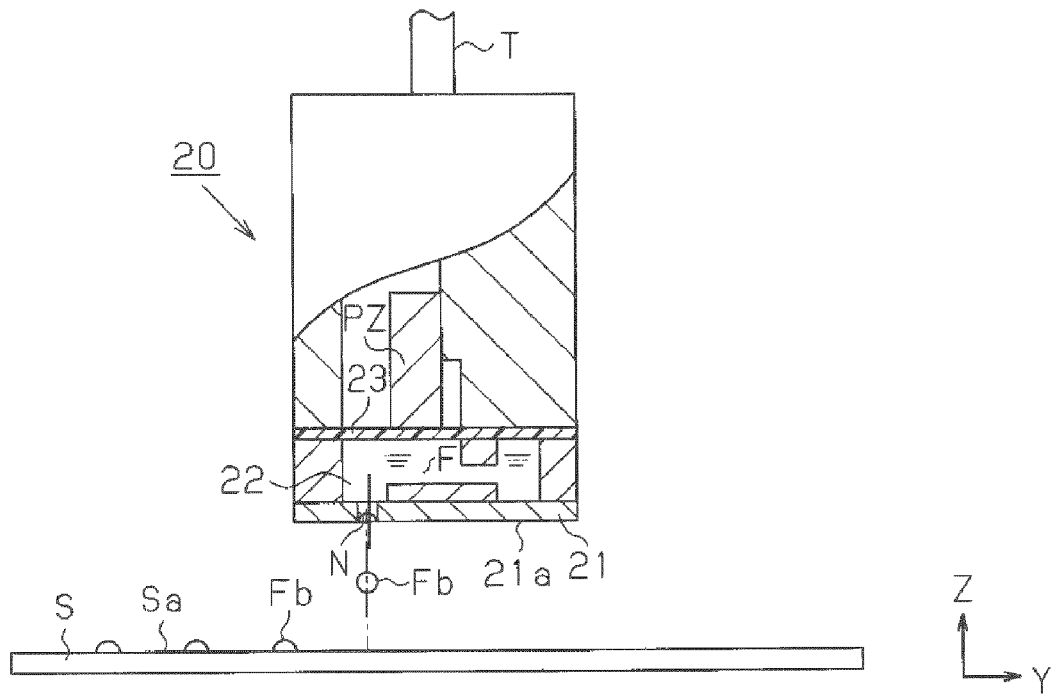
FIG. 2 is a schematic view showing a state of discharging a droplet from a droplet discharge head to a green sheet according to the first embodiment of the invention.

As shown in FIG. 2, the droplet discharge head 20 is provided with a nozzle plate 21 at the bottom side thereof. The nozzle plate 21 has the bottom surface (hereinafter, referred to as merely "nozzle forming surface 21a") that is approximately parallel to the upper surface of the green sheet S (hereinafter, referred to as merely "discharge surface Sa"). When the green sheet S is positioned directly under the discharge head 20, a distance between the nozzle forming surface 21a of the nozzle plate 21 and the discharge surface Sa, that is a platen gap, is maintained at a predetermined distance (for example, 500 μm).

Figure 3:
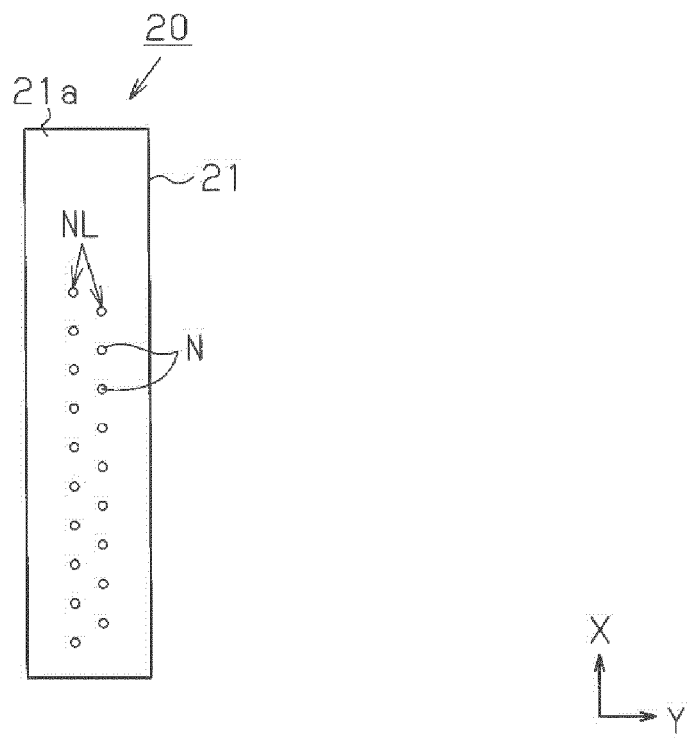
FIG. 3 is an explanatory diagram showing an arrangement of nozzles of the droplet discharge head according to the first embodiment of the invention.

In FIG. 3, the nozzle forming surface 21a is provided with a pair of nozzle rows NL composed of a plurality of nozzles N arranged along X-arrow direction. Each nozzle row of the pair of nozzle rows NL has 180 nozzles N in every inch. FIG. 3 shows 10 nozzles N in each row for the sake of convenience of explanation.

In the pair of nozzle rows NL, each nozzle N included to one nozzle row NL fills each gap between the nozzles N included to the other nozzle row NL when they are viewed in Y-arrow direction. Namely, the discharge head 20 includes 180 nozzles N at each row, that is, 360 nozzles N at both of the rows in every inch in X-arrow direction. Namely, the maximum resolution in X-arrow direction is 360 dpi.

In FIG. 2, a supply tube T is connected to the upper side of the discharge head 20. The supply tube T is formed to extend in Z-arrow direction, and supplies the metal ink F from the ink pack 33 housed in the pack storage 16 to the discharge head 20.

On the upper side of each of the nozzles N, a cavity 22 communicating with the supply tube T is formed. The cavity 22 stores the metal ink F supplied from the supply tube T and supplies part of the metal ink F which is stored therein to the nozzle N which is communicated therewith. On the upper side of the cavity 22, a vibration plate 23 is provided. The vibration plate 23 vibrates along Z-arrow direction so as to increase and decrease the volume of the cavity 22. On the upper side of the vibration plate 23, a piezoelectric element PZ is provided for every nozzle N. The piezoelectric element PZ stretches and constricts along Z-arrow direction so as to vibrate the vibration plate 23 along Z-arrow direction. Vibration of the vibration plate 23 along Z-arrow direction allows the metal ink F to be discharged from the nozzle N in the droplets Fb having a predetermined size. The droplets Fb that are discharged from the nozzle N travel toward reverse Z-arrow direction and then land on the discharge surface Sa of the green sheet S.

Figure 4:
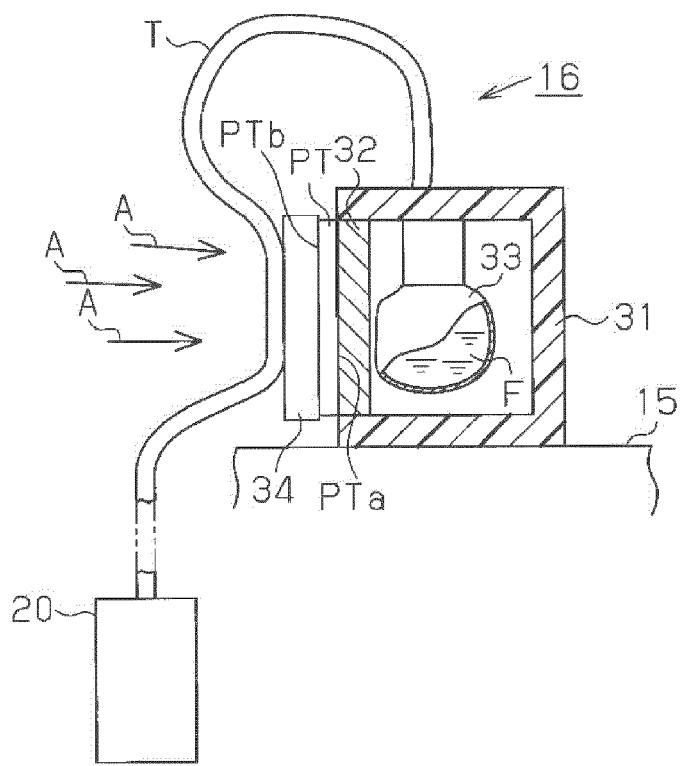
FIG. 4 is a sectional view showing a major structure of a pack storage housing an ink-pack according to the first embodiment of the invention.

The pack storage 16 will now be described with reference to FIG. 4. FIG. 4 shows a section of a major structure of the pack storage 16.

Referring to FIG. 4, a side wall at a front side of the pack storage 16, that is, at reverse Y-arrow direction is a heat conducting plate 32 made of stainless, for example. Further, each side wall other than the side wall at the front side of the pack storage 16 is made of heat insulating material 31. The ink pack 33 that stores the metal ink F is housed in a space surrounded by these heat insulating materials 31 and the heat conducting plate 32. The ink pack 33 contacts an inner surface of the heat conducting plate 32.

The ink pack 33 housed in the pack storage 16 is coupled through the supply tube T to the discharge head 20. The ink pack 33 supplies the cavity 22 with the metal ink F through the supply tube T. The inside of the pack storage 16 is coupled through a suction tube (not shown) to a suction pump VP (see FIG. 5). The suction pump VP sucks the inside of the pack storage 16 so as to produce a negative pressure there. The suction pump VP adjusts the negative pressure of the inside of the pack storage 16 so as to adjust pressure that is to be given to the ink pack 33. Thus the supply quantity of the metal ink F is adjusted.

To an outer surface of the heat conducting plate 32, a Peltier element PT as a cooling means or a heating means is attached. The Peltier element PT contacts the outer surface of the heat conducting plate 32 at a cooling part PTa thereof. The cooling part PTa of the Peltier element PT cools down the inside of the pack storage 16 via the heat conducting plate 32. This cooling cools down the metal ink F in the ink pack 33 provided to the inside of the pack storage 16. The cooling part PTa of the Peltier element PT cools the metal ink F in the ink pack 33 down to 5 degrees Celsius in the embodiment. This cooling can suppress the secondary aggregation of the metal particulates, namely can prevent the deterioration of the ink F.

At a heat generating part PTb of the Peltier element PT, a blower 34 is provided. The blower 34 rotates a fan (not shown) by a fan motor MF (see FIG. 5) to suck the surrounding air A. Then the blower 34 blows the air A which is sucked to the heat generating part PTb of the Peltier element PT. The supply tube T contacts a suction side of the blower 34.

Accordingly, the metal ink F that is cooled in the ink pack 33 housed in the pack storage 16 carries out the heat exchange with the air A sucked by the blower 34 along the way being supplied through the supply tube T to the discharge head 20. Namely, the air A at the common temperature (20 degrees Celsius) hits the supply tube T when the air A is sucked by the blower 34. At this time, the air A at the common temperature increases heat quantity of the metal ink F that flows in the supply tube T and is at 5 degrees Celsius, warming the metal ink F. Consequently, the metal ink F warmed by the heat exchange is supplied to the discharge head 20.

On the other hand, the air A that is sucked by the blower 34 is cooled by the heat exchange with the metal ink F. The air A that is cooled is blown to the heat generating part PTb of the Peltier element PT by the blower 34. This blowing cools the heat generating part PTb, so that the Peltier element PT can improve the cooling effect of the cooling part PTa thereof.

An electrical structure of the droplet discharging device 10 structured as above will now be described with reference to FIG. 5.

Figure 5:
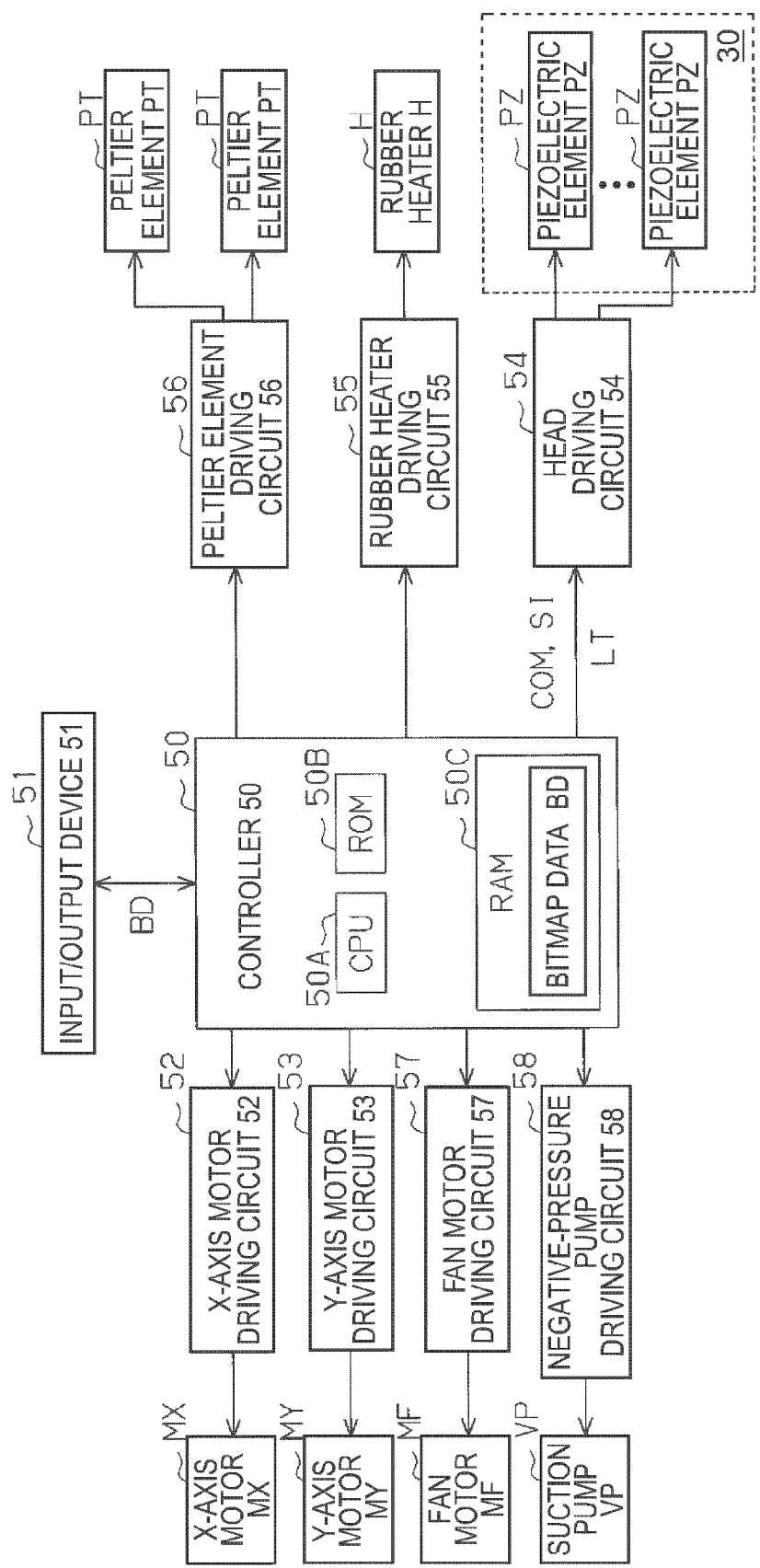
FIG. 5 is an electric block circuit diagram for explaining an electrical structure of the droplet discharging device according to the first embodiment of the invention.

In FIG. 5, a controller 50 includes CPU 50A, ROM 50B, and RAM 50C. The controller 50 carries out a conveying process of the stage 13, a conveying process of the carriage 19, a droplet discharging process of the discharge head 20, a heating process of the rubber heater H, a drive control of the Peltier element PT, a drive control of the blower 34, and the like in accordance with various data and various control programs that are stored therein.

To the controller 50, an input/output device 51 having various operation switches and displays is coupled. The input/output device 51 displays a processing state of each process which is carried out by the droplet discharging device 10. The input/output device 51 produces bitmap data BD for forming a pattern by the droplet Fb on the green sheet S and inputs the bitmap data BD to the controller 50.

The bitmap data BD is data defining "on" or "off" of each piezoelectric element PZ in accordance with a value (0 or 1) of each bit. The bitmap data BD is data defining whether the droplet Fb is discharged or not on each position of a drawing plane surface (discharge surface Sa) above which the discharge head 20, namely each nozzle N, passes through. In other words, the bitmap data BD is data for discharging the droplet Fb on a desired forming position of a pattern defined on the discharge surface Sa.

To the controller 50, an X-axis motor driving circuit 52 is coupled. The controller 50 outputs a driving control signal to the X-axis motor driving circuit 52. The X-axis motor driving circuit 52 responds to the driving control signal received from the controller 50 to normally or reversely rotate an X-axis motor MX for conveying the carriage 19.

To the controller 50, a Y-axis motor driving circuit 53 is coupled. The controller 50 outputs a driving control signal to the Y-axis motor driving circuit 53. The Y-axis motor driving circuit 53 responds to the driving control signal received from the controller 50 to normally or reversely rotate a Y-axis motor MY for conveying the stage 13.

To the controller 50, a head driving circuit 54 is coupled. The controller 50 produces a discharge timing signal LT synchronized with a predetermined discharge frequency so as to output it to the driving circuit 54. The controller 50 synchronizes a driving voltage COM for driving each of piezoelectric elements PZ with the discharge frequency so as to output it to the head driving circuit 54.

The controller 50 produces a pattern forming control signal SI for driving each of the piezoelectric elements PZ according to the desired pattern forming position, based on the bitmap data BD so as to serially transfer the pattern forming control signal SI to the head driving circuit 54. The head driving circuit 54 sequentially serial/parallel converts the pattern forming control signal SI received from the controller 50 in accordance with each of the piezoelectric elements PZ. Whenever the head driving circuit 54 receives the discharge timing signal LT outputted from the controller 50, the head driving circuit 54 latches the pattern forming control signal SI, which is serial/parallel converted, to supply the driving voltage COM to the piezoelectric element PZ selected by the pattern forming control signal SI.

To the controller 50, a rubber heater driving circuit 55 is coupled. The controller 50 outputs a driving control signal to the rubber heater driving circuit 55. The rubber heater driving circuit 55 responds to the driving control signal received from the controller 50 to drive the rubber heater H, controlling the temperature of the green sheet S placed on the stage 13 to a predetermined temperature. The predetermined temperature of the green sheet S is 46 degrees Celsius in the embodiment. Thus the green sheet S increases the drying speed of the droplet Fb that lands thereon.

To the controller 50, a Peltier element driving circuit 56 is coupled. The controller 50 outputs a driving control signal to the Peltier element driving circuit 56. The Peltier element driving circuit 56 responds to the driving control signal received from the controller 50 to drive a Peltier element PT. The Peltier element PT attached to the heat conducting plate 32 of the pack storage 16 cools the inside of the pack storage 6 down to 5 degrees Celsius. Namely, the cooling by the Peltier element PT cools the metal ink F in the ink pack 33 housed in the pack storage 16 down to 5 degrees Celsius, preventing the ink from deteriorating.

To the controller 50, a fan motor driving circuit 57 is coupled. The controller 50 outputs a driving control signal to the fan motor driving circuit 57. The fan motor driving circuit 57 responds to the driving control signal received from the controller 50 to drive a fan motor MF that rotates a fan of the blower 34. If the fan motor MF is driven to rotate the fan, the blower 34 sucks the air A which is at a common temperature and is at the circumference of the droplet discharging device 10 via the supply tube T. Then the blower 34 blows the air A which is sucked to the heat generating part PTb of the Peltier element PT. Accordingly, when the air A positively flows toward the blower 34, the heat exchange is carried out between the air A and the supply tube T. Thus the supply tube T is warmed to warm the metal ink F thereinside. On the other hand, the air A which flows toward the blower 34 is cooled by the metal ink F, thereby effectively cooling down the heat generating part PTb of the Peltier element PT.

To the controller 50, a negative-pressure generating pump driving circuit 58 is coupled. The controller 50 outputs a driving control signal to the negative-pressure generating pump driving circuit 58. The negative-pressure generating pump driving circuit 58 responds to the driving control signal received from the controller 50 to drive the suction pump VP, producing a predetermined negative pressure in the inside of the pack storage 16. The suction pump VP adjusts the negative pressure of the inside of the pack storage 16, so that the inner pressure of the ink pack 33 is adjusted, adjusting the supply quantity of the metal ink F.

Next, operations of the droplet discharging device 10 will now be described.

As shown in FIG. 1, the green sheet S is placed on the stage 13 such that the discharge surface Sa is arranged on the upper side. At this time, the stage 13 is disposed at the reverse Y-arrow direction side in relation to the carriage 19.

At this state, the controller 50 receives the bitmap data BD for forming a wiring pattern by the droplet Fb, from the input/output device 51. The controller 50 stores the bitmap data BD received from the input/output device 51.

The controller 50 drives the rubber heater H via the rubber heater driving circuit 55 so as to evenly control the temperature of the whole green sheet S placed on the stage 13 at a predetermined temperature.

The controller 50 drives the Peltier element PT via the Peltier element driving circuit 56 so as to cool the metal ink F in the ink pack 33 housed in the pack storage 16 down to 5 degrees Celsius. The controller 50 drives the fan motor MF via the fan motor driving circuit 57 so as to suck the air A which is at a common temperature and at the circumference of the droplet discharging device 10 via the fan motor driving circuit 57. Then the air A which is sucked is blown to the heat generating part PTb of the Peltier element PT. Then the controller 50 warms the metal ink F which is cooled down to 5 degrees Celsius by the heat exchange between the air A and the metal ink F so as to supply the metal ink F to the discharge head 20.

After that, the controller 50 drives the X-axis motor MX via the X-axis motor driving circuit 52 so as to move the discharge head 20 such that the green sheet S passes directly under the discharge head 20 in the Y-arrow direction. Then the controller 50 drives the Y-axis motor MY via the Y-axis driving circuit 53 so as to start moving (moving forth) the stage 13.

Once the controller 50 starts the moving (moving forth) of the stage 13, the controller 50 produces the pattern forming control signal SI based on the bitmap data BD to output the pattern forming control signal SI and the driving voltage COM to the head driving circuit 54. Namely, the controller 50 drives each of the piezoelectric elements PZ via the head driving circuit 54 so as to discharge the droplet Fb from the nozzle N which is selected, every time the desired pattern forming position passes directly under the discharge head 20. The droplet Fb which lands on the green sheet S is dried shortly after the landing because the green sheet S is heated. Thus the wiring pattern is formed on the green sheet S.

Here, advantageous effects of the first embodiment will be described below.

(1) According to the embodiment, the Peltier element PT is mounted on the heat conducting plate 32 of the pack storage 16. The Peltier element PT cools the inside of the pack storage 16 to cool the metal ink F in the ink pack 33 that is housed in the storage 16 down to a temperature (5 degrees Celsius) at which the ink does not cause an aggregation constantly. Therefore, the metal ink F stored in the ink pack 33 does not deteriorate.

(2) According to the embodiment, the blower 34 is mounted at the heat generating part PTb of the Peltier element PT and contacts the supply tube T at the suction side thereof. The blower 34 actively allows the surrounding air A which is at a common temperature to contact the supply tube T, and sucks the air A. Then the blower 34 blows the air A which is sucked to the heat generating part PTb of the Peltier element PT.

Namely, the surrounding air A which is warm as being at the common temperature carries out the heat exchange with the supply tube T, heating the metal ink F flowing in the supply tube T. Thus the metal ink F which is cooled down to 5 degrees Celsius is warmed by the air A so as to be supplied to the discharge head 20 with low viscosity. Accordingly, the clogging of the nozzle N of the droplet discharge head 20 is prevented from occurring.

Further, in the embodiment, since the metal ink F is warmed by the heat energy of the surrounding air A, the heating means for merely heating the metal ink F is not needed. Thus energy saving can be achieved in the pattern forming. Further, since the number of components can be decreased, the droplet discharging device 10 can be formed small in size (achieve space saving) and achieve natural resource saving, namely be friendly to the environment.

(3) According to the embodiment, the air which is cooled by the heat exchange with the metal ink F cools the heat generating part PTb of the Peltier element PT. Namely, the cooling of the heat generating part PTb of the Peltier element PT can increase the cooling effect of the cooling part PTa, being able to decrease the power consumption (achieve energy saving) of the Peltier element PT.

Second Embodiment

A second embodiment of the invention will be described below with reference to FIGS. 6 to 9. A structure of the second embodiment includes a laser device adding to the structure of the first embodiment. In the second embodiment, the alteration is mainly described in detail. Elements that are common to the first embodiment are indicated by the same reference numerals.

Figure 6:
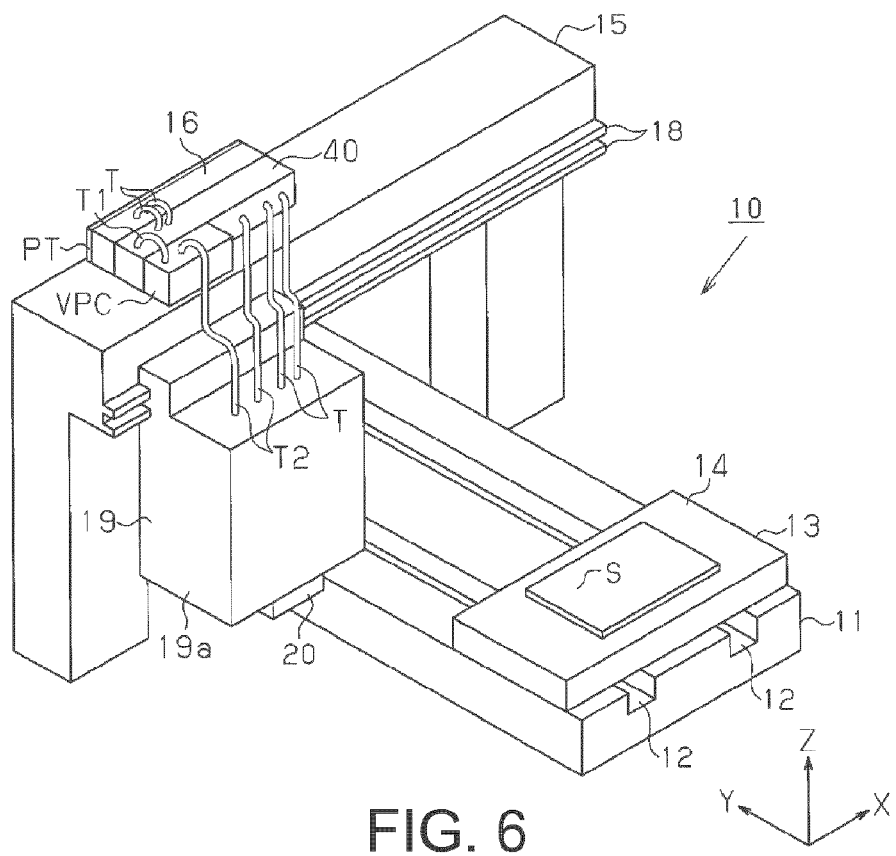
FIG. 6 is a whole perspective view showing a droplet discharging device according to a second embodiment of the invention.

In FIG. 6, the pack storage 16 includes the Peltier element PT as a cooling means so as to cool the metal ink F stored therein down to 5 degrees Celsius. The metal ink F is supplied to the discharge head 20 through the supply tube T that is coupled to the pack storage 16. The supply tube T couples the pack storage 16 with the discharge head 20 in a manner passing through a heat exchanger 40. The metal ink F that is cooled in the pack storage 16 is warmed when it passes through the heat exchanger 40, and then is supplied to the discharge head 20. The metal ink F supplied to the discharge head 20 is discharged to the green sheet S in droplets Fb from the discharge head 20.

Figure 7:
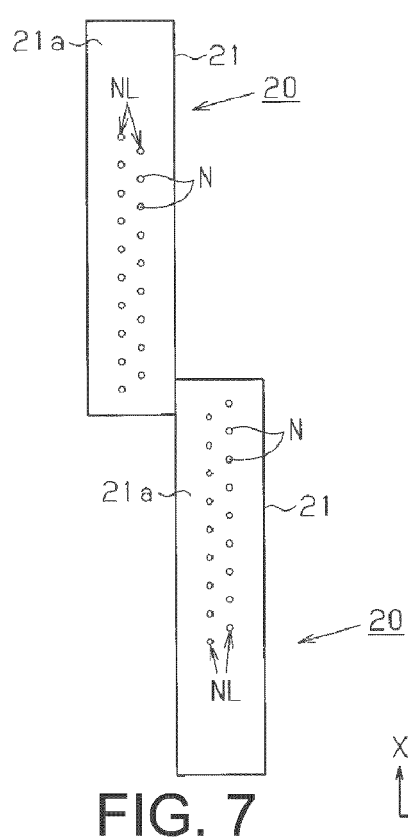
FIG. 7 is a schematic view showing an arrangement of droplet discharge heads according to the second embodiment of the invention.

FIG. 7 is a schematic view showing two discharge heads 20 mounted on the carriage 19 viewed from the green sheet S side (from the bottom side). The two discharged heads 20 are arranged in Y-arrow direction. The two discharge heads 20 are arranged to be overlapped partially when viewed from Y-arrow direction and be in parallel to each other along X-arrow direction.

Figure 8:
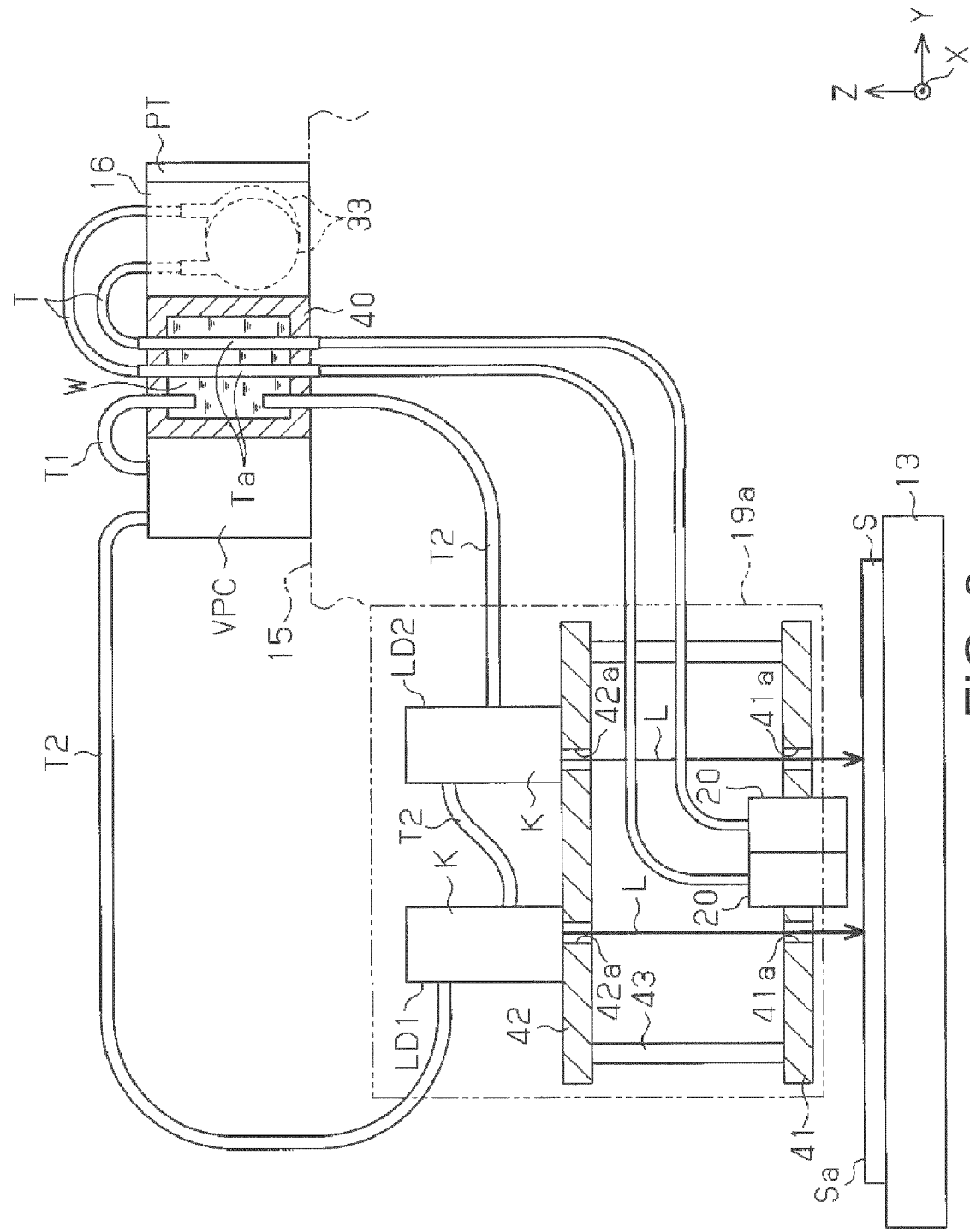
FIG. 8 is a schematic view for explaining a heat exchange system and a circulation system of cooling water according to the second embodiment of the invention.

Referring to FIG. 8, in a case 19a of the carriage 19, a space holding member 43 connects a lower supporting plate 41 and an upper supporting plate 42. To the lower supporting plate 41, the two discharge heads 20 are fixed. To the upper supporting plate 42, a first semiconductor laser device LD1 and a second semiconductor laser device LD2 as light sources are respectively fixed.

Each of the first semiconductor laser device LD1 and the second semiconductor laser device LD2 includes a rectangular parallelepiped case K that is formed long in X-arrow direction. The case K of the first semiconductor laser device LD1 is arranged at a position that is more reverse Y-arrow direction in relation to the two discharge heads 20 in the coordinate space of Y-arrow direction. The case K of the second semiconductor laser device LD2 is arranged at a position that is more Y-arrow direction in relation to the two discharge heads 20 in the coordinate space of Y-arrow direction.

Each of the case K of the first semiconductor laser device LD1 and the case K of the second semiconductor laser device LD2 includes the same number of semiconductor lasers LS (see FIG. 9) as the number of the nozzles N included to each of the two discharge heads 20. Further, each of the case K of the first semiconductor laser device LD1 and the case K of the second semiconductor laser device LD2 respectively includes a laser driving circuit 60 (see FIG. 9) for driving each of the semiconductor lasers LS.

The semiconductor lasers LS respectively emit laser light L toward the discharge surface Sa. The laser light L emitted from the first semiconductor laser device LD1 passes through through-holes 42a and 41a that are respectively formed on the upper supporting plate 42 and the lower supporting plate 41 to be sent toward reverse Y-arrow direction in relation to each of the nozzles N. Further, the laser light L emitted from the second semiconductor laser device LD2 passes through through-holes 42a and 41a that are respectively formed on the upper supporting plate 42 and the lower supporting plate 41 to be sent toward Y-arrow direction in relation to each of the nozzles N.

Namely, the laser light L emitted from the first semiconductor laser device LD1 irradiates the droplets Fb that are discharged from each of nozzles N when the droplets Fb are at the reverse Y-arrow direction in relation to the nozzles N. The laser light L emitted from the second semiconductor laser device LD2 irradiates the droplets Fb that are discharged from each of the nozzles N when the droplets Fb are at the Y-arrow direction in relation to the nozzles N.

When the stage 13 moves toward reverse Y-arrow direction and the droplets Fb are discharged from the nozzles N of the discharge heads 20, the laser light L emitted from the first semiconductor laser device LD1 irradiates the droplets Fb that land on the green sheet S. On the other hand, when the stage 13 moves toward Y-arrow direction and the droplets Fb are discharged from the nozzles N of the discharge heads 20, the laser light L emitted from the second semiconductor laser device LD2 irradiates the droplets Fb that land on the green sheet S. The laser light L applied to the droplets Fb heats and helps the droplets Fb be dried by energy thereof.

In FIG. 8, a side wall at the back side of the pack storage 16 is a heat conducting plate made of, for example, stainless. Each side wall other than the one at the back side of the pack storage 16 is made of heat insulating material. In a space surrounded by these heat insulating material and a heat conducting plate, an ink pack 33 that stores the metal ink F is housed, as shown in dashed line in FIG. 8. The ink pack 33 contacts an inner surface of the heat conducting plate. The Peltier element PT cools the inside of the pack storage 16 at the cooling part thereof via the heat conducting plate, namely cools the metal ink F in the ink pack 33. The Peltier element PT cools the metal ink F in the ink pack 33 down to 5 degrees Celsius in the embodiment. This cooling suppresses the secondary aggregation of the metal particulates to prevent the deterioration of the metal ink F.

The supply tube T is a flexible tube made of synthetic resin and includes a stainless pipe Ta at a portion passing through the inside of the heat exchanger 40. The stainless pipe Ta raises the efficiency of the heat exchange between cooling water W as a refrigerant filling the heat exchanger 40 and the metal ink F which flows in the stainless pipe Ta, warming the metal ink F that flows in the supply tube T.

To the front side of the heat exchanger 40, a circulation pump VPC is provided. The circulation pump VPC pumps up the cooling water W that is in the heat exchanger 40 through a suction tube T1. The circulation pump VPC allows the cooling water W which is pumped up thereby to go through a lead out tube T2 around each of the lasers LS of the first semiconductor laser device LD1 and each of the lasers LS of the second semiconductor laser device LD2 and then return to the heat exchanger 40.

The cooling water W to be returned to the heat exchanger 40 receives heat from each of the semiconductor lasers LS and from circuit elements mounted on the laser driving circuit 60 so as to be warmed. The heat of the cooling water W that is warmed is given to the metal ink F in the heat exchanger 40. Namely, the cooling water W that is warmed is cooled by the heat exchange with the metal ink F. The cooling water W that is cooled in the heat exchanger 40 is pumped up by the circulation pump VPC again to be sent to the first semiconductor laser device LD1 and the second semiconductor laser device LD2. Thus, the insides of the first semiconductor laser device LD1 and the second semiconductor laser device LD2 are cooled.

The circulation pump VPC has a cooling mechanism. The cooling water W that is pumped up is cooled further in the circulation pump VPC to be sent to the first semiconductor laser device LD1 and the second semiconductor laser device LD2. As a result, the insides of the first semiconductor laser device LD1 and the second semiconductor laser device LD2 are further effectively cooled.

Figure 9:
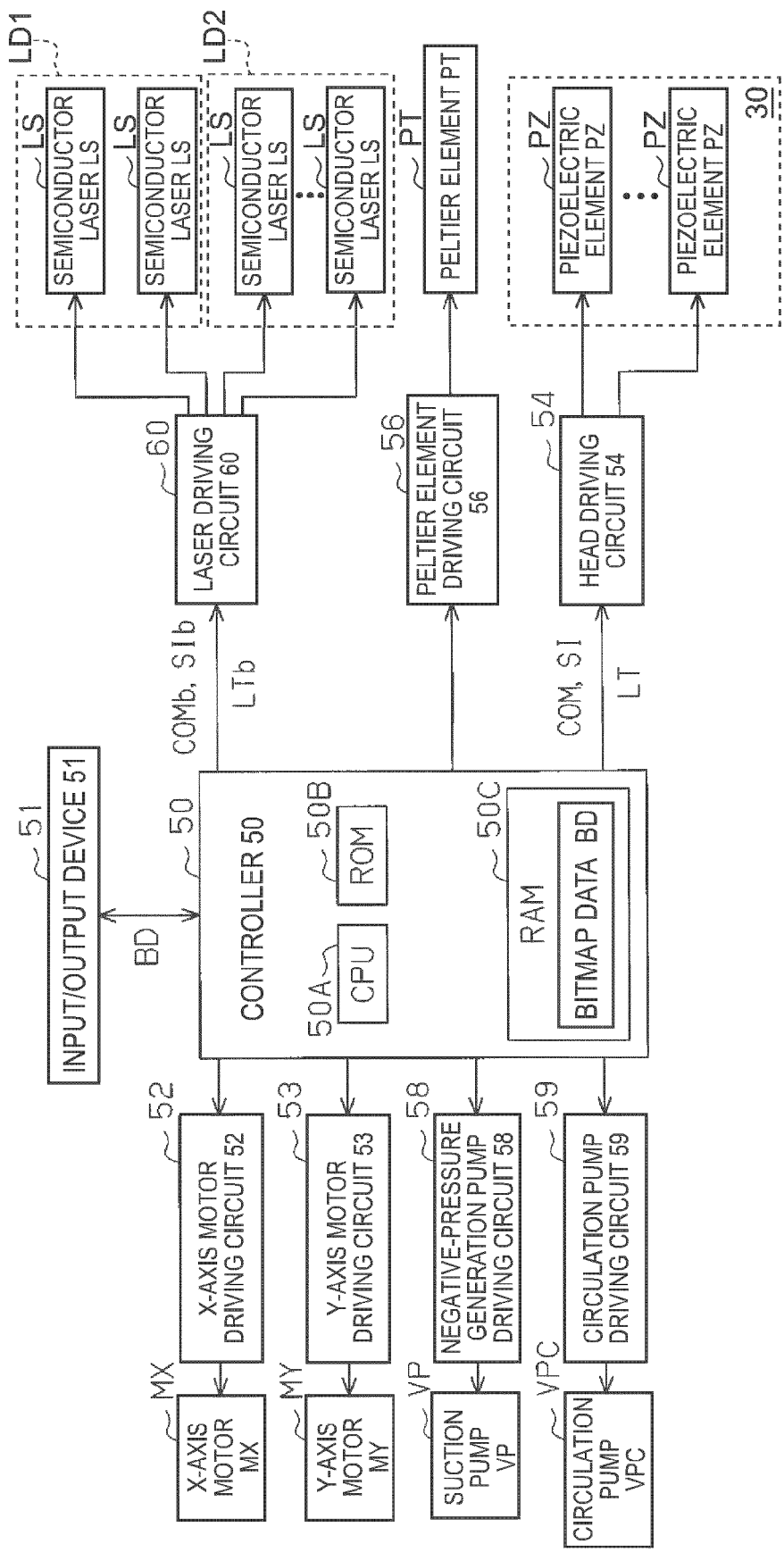
FIG. 9 is an electric block circuit diagram for explaining an electrical structure of the droplet discharging device according to the second embodiment of the invention.

An electrical structure of the droplet discharging device 10 structured as above will now be described with reference to FIG. 9. The controller 50 carries out a conveying process of the stage 13, a conveying process of the carriage 19, and a droplet discharging process of the discharge head 20 in accordance with various data and various control programs that are stored therein. In addition, the controller 50 also carries out an irradiation process of the first semiconductor laser device LD1 and the second semiconductor laser device LD2, a cooling process of the Peltier element PT, a suction process of the suction pump VP, a circulation process of the circulation pump VPC, and the like.

To the controller 50, a circulation pump driving circuit 59 is coupled. The controller 50 outputs a driving control signal to the circulation pump driving circuit 59. The circulation pump driving circuit 59 responds to the driving control signal received from the controller 50 to drive the circulation pump VPC. The driving of the circulation pump VPC allows the cooling water W therein to go around a closed loop composed of the tubes T1, T2, the circulation pump VPC, the first semiconductor laser device LD1, the second semiconductor laser device LD2, and the heat exchanger 40.

To the controller 50, a laser driving circuit 60 is coupled. As is the case with the head driving circuit 54, the controller 50 produces an irradiation timing signal LTb synchronized with a predetermined irradiation frequency so as to output it to the laser driving circuit 60. The controller 50 selects either the first semiconductor laser device LD1 or the second semiconductor laser device LD2. The controller 50 produces a driving voltage COMb synchronized with the irradiation frequency so as to output it to the laser driving circuit 60. The driving voltage COMb is used for allowing each of the semiconductor lasers LS of the semiconductor laser device that is selected to emit the laser light L.

When the stage 13 moves toward reverse Y-arrow direction to form a pattern, the controller 50 selects the first semiconductor laser device LD1 and outputs the driving voltage COMb, which is used for allowing each of the semiconductor lasers LS of the first semiconductor laser device LD1 to emit the laser light L, to the laser driving circuit 60. On the other hand, when the stage 13 moves toward Y-arrow direction to form a pattern, the controller 50 selects the second semiconductor laser device LD2 and outputs the driving voltage COMb, which is used for allowing each of the semiconductor lasers LS of the second semiconductor laser device LD2 to emit the laser light L, to the laser driving circuit 60.

The controller 50 produces a pattern forming control signal SIb for driving each of the semiconductor lasers LS in accordance with the desired pattern forming position, based on the bitmap data BD so as to serially transfer the pattern forming control signal SIb to the driving circuit 60. The laser driving circuit 60 sequentially serial/parallel converts the pattern forming control signal SIb received from the controller 50 with respect to each of the semiconductor lasers LS. Whenever the laser driving circuit 60 receives the irradiation timing signal LTb outputted from the controller 50, the laser driving circuit 60 latches the pattern forming control signal Sib that is serial/parallel converted so as to supply the semiconductor lasers LS selected by the pattern forming control signal SIb with the driving voltage COMb.

Next, operations of the droplet discharging device 10 will now be described.

As shown in FIG. 6, the green sheet S is placed on the stage 13 such that the discharge surface Sa is arranged on the upper side. At this time, the green sheet S placed on the stage 13 is disposed at the reverse Y-arrow direction side in relation to the carriage 19.

At this state, the controller 50 receives the bitmap data BD for forming a wiring pattern by the droplet Fb, from the input/output device 51. The controller 50 stores the bitmap data BD received from the input/output device 51.

The controller 50 drives the Peltier element PT via the Peltier element driving circuit 56 so as to cool the metal ink F in the ink pack 33 housed in the pack storage 16 down to 5 degrees Celsius. The controller 50 drives the circulation pump VPC via the circulation pump driving circuit 59 so as to pump up the cooling water W of the heat exchanger 40 and allow the water W to go around. The metal ink F that is cooled down to 5 degrees Celsius is warmed by the heat exchange with the cooling water W in the heat exchanger 40 so as to be supplied to the discharge head 20. The controller 50 drives a suction pump VP via the negative-pressure generation pump driving circuit 58 so as to adjust the negative pressure in the pack storage 16, adjusting the supply quantity of the metal ink F.

Then the controller 50 drives the Y-axis motor MY via the Y-axis motor driving circuit 53 so as to start conveying the stage 13. Once the controller 50 starts conveying the stage 13, the controller 50 produces the pattern forming control signal SI based on the bitmap data BD so as to output the pattern forming control signal SI and the driving voltage COM to the head driving circuit 54. Namely, the controller 50 drives each of the piezoelectric elements PZ via the head driving circuit 54 so as to discharge the droplet Fb from the nozzle N that is selected, every time the desired forming position passes directly under the discharge head 20.

In addition, the controller 50 produces the pattern forming control signal SIb based on the bitmap data BD so as to output the pattern forming control signal SIb and the driving voltage COMb to the laser driving circuit 60. The controller 50 drives each of the semiconductor lasers LS (each of the semiconductor lasers LS of the first semiconductor laser device LD1, in this case) via the laser driving circuit 60 so as to irradiate the droplet Fb with the laser light L from the semiconductor laser LS that is selected, every time the droplet Fb that lands on the green sheet S passes through a position that is to be irradiated with the laser light L. The laser light L heats the droplet Fb that lands on the green sheet S so as to dry the droplet Fb instantly. Thus the desired wiring pattern is formed on the green sheet S.

Here, advantageous effects of the second embodiment will be described below.

(4) According to the embodiment, the heat exchanger 40 carries out the heat exchange between the metal ink F that is cooled and the cooling water W that is warmed so as to warm the metal ink F. Thus the heat exchanger 40 decreases the viscosity of the metal ink F, so that the metal ink F having low viscosity is supplied to the inside of the discharge head 20. Accordingly, the clogging of the nozzle N of the droplet discharge head 20 is prevented from occurring. Further, the discharge quantity of the droplet Fb from the discharge head 20 can be stabilized, being able to form a pattern with high accuracy in size and shape.

(5) According to the embodiment, the cooling water W that is cooled by the metal ink F goes around the first semiconductor laser device LD1 and the second semiconductor laser device LD2 to be warmed again by waste heat from each of the semiconductor lasers LS and the circuit elements. Namely, the embodiment does not need a heating means for merely heating the metal ink F or the cooling water W. Thus the droplet discharging device 10 can achieve energy-saving. In addition, since the number of components can be decreased, the droplet discharging device 10 can be formed small in size (achieve space saving). Thus the droplet discharging device 10 can achieve natural resource saving, namely be friendly to the environment.

(6) In addition, in the first semiconductor laser device LD1 and the second semiconductor laser device LD2, each of the semiconductor lasers LS and the circuit elements is cooled by the cooling water W, being able to suppress fluctuation of the operation property due to the heat generation thereof. Further, the droplet discharging device 10 does not need the cooling means for merely cooling the cooling water W, being able to achieve energy-saving. In addition, since the number of components can be decreased, the droplet discharging device 10 can be formed small in size (achieve space saving). Thus the droplet discharging device 10 can achieve natural resource saving, namely be friendly to the environment.

(7) According to the embodiment, the supply tube T includes the stainless pipe Ta having high heat conductivity at the inside of the heat exchanger 40. Therefore, the heat exchanger 40 can improve the efficiency of the heat exchange between the metal ink F that is cooled and the cooling water W that is warmed.

(8) According to the embodiment, the cooling water W is cooled by the cooling mechanism of the circulation pump VPC as well as by the heat exchanger 40. Therefore, each of the semiconductor lasers LS and the circuit elements of the first semiconductor laser device LD1 and the second semiconductor laser device LD2 can be cooled with higher cooling effect.

The above-mentioned embodiments may be changed as the following.

In the first embodiment, the blower 34 can be omitted. Namely, the supply tube T may be attached directly to the heat generating part PTb of the Peltier element PT. Accordingly, the supply tube T (the metal ink F) can directly cool down the heat generating part PTb of the Peltier element PT. In this case as well, one Peltier element PT can achieve cooling the ink pack 33 (the metal ink F) housed in the pack storage 16 and heating the metal ink F. Thus the droplet discharging device 10 effectively uses the heat generated from the Peltier element PT so that the droplet discharging device 10 can include fewer components and achieve energy-saving, namely be friendly to the environment. In a word, it is enough that the supply tube T thermally contacts with the heat generating part PTb of the Peltier element PT.

Figure 10:
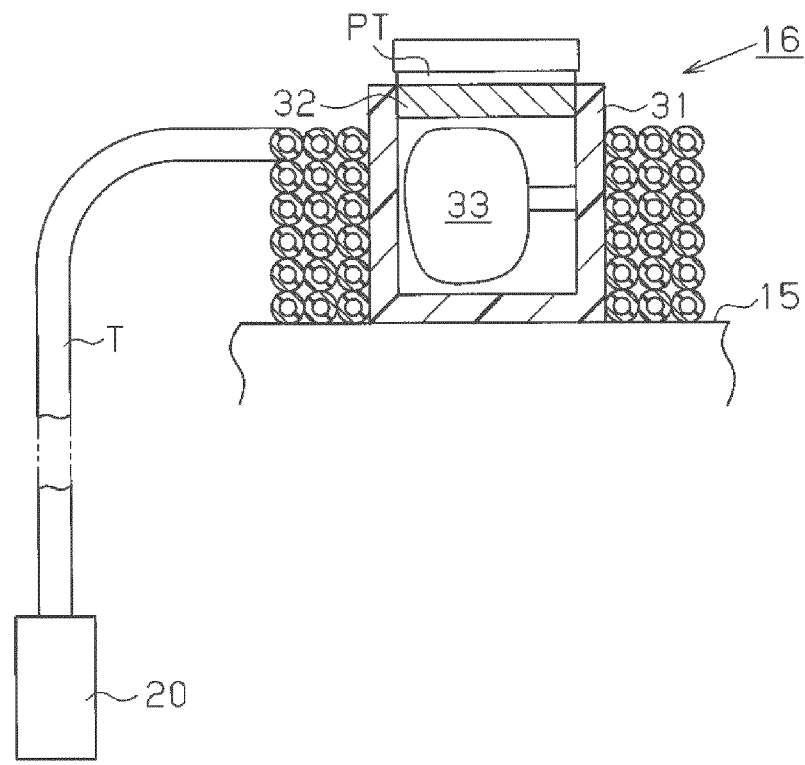
FIG. 10 is a sectional view showing a major structure of a pack storage according to a modification of the invention.

In the first embodiment, the supply tube T contacts the blower 34. As shown in FIG. 10, the supply tube T may be multiply-wound around the outer walls of the heat insulating material 31 of the pack storage 16. At this time, it is preferable that the upstream side of the supply tube T be disposed at the inner winding and the downstream side of the supply tube T be disposed at the outer winding.

Thus, this structure can increase the distance that the metal ink F flows from the pack storage 16 to the discharge head 20 through the supply tube T, namely the chance of heating the metal ink F by the air A is increased. Thus the droplet discharging device 10 can save the energy that is needed to warm the metal ink F.

In addition, the supply tube T is wound such that the upstream side thereof is disposed at the inner winding of the whole supply tube T and the downstream side thereof is disposed at the outer winding. Accordingly, the supply tube T can improve the heat insulating effect of the pack storage 16 with respect to the external air.

Further, the supply tube T is wound around the pack storage 16, so that the droplet discharging device 10 can be formed small in size, that is, formed in space saving shape.

In the first embodiment, the Peltier element PT cools down the ink pack 33 (the metal ink F) housed in the pack storage 16 and heats the metal ink F supplied through the supply tube T to the discharge head 20. However, a heat pump may be used as substitute for the Peltier element PT in the droplet discharging device 10.

At this time, a cool side (cooling part) of the heat pump cools down the ink pack 33 (the metal ink F) in the pack storage 16, and a warm side (heat generating part) thereof warms the metal ink F that is to be supplied to the discharge head 20. Here, the warm side of the heat pump may warm the green sheet S at the same time.

Figure 11:
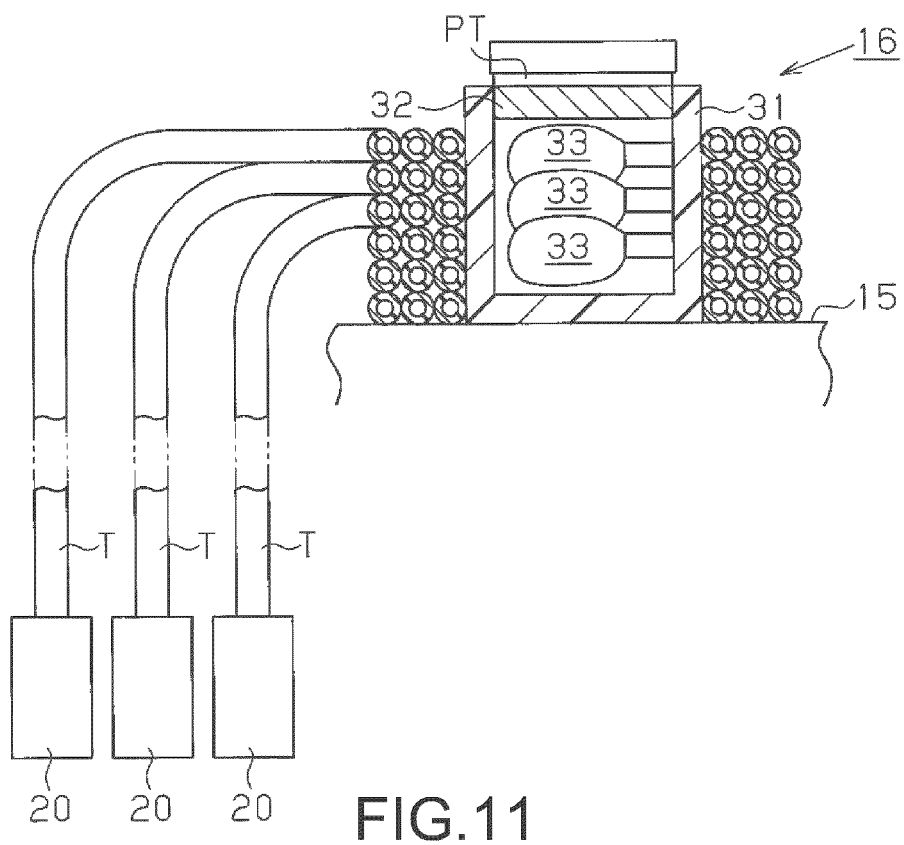
FIG. 11 is a sectional view showing a major structure of a pack storage according to a modification of the invention.

While the droplet discharging device 10 includes one droplet discharge head 20 in the first embodiment, the number of the droplet discharge head 20 is not limited. The droplet discharging device 10 may include a plurality of droplet discharge heads 20. In this case, as shown in FIG. 11, the pack storage 16 houses a plurality of ink packs 33 for the plurality of discharge heads 20. Each of supply tubes T coupling each of the ink packs 33 and the each of the discharge heads 20 is multiply-wound around the outer walls of the heat insulating material 31 of the pack storage 16. When the supply tubes T is multiply-wound, the supply tubes T may be wound such that the upstream sides of the supply tubes T are disposed at the inner winding and the downstream sides of the supply tubes T are disposed at the outer winding.

In the first embodiment, the blower 34 warms the meal ink F flowing in the supply tube T by the heat exchange between surrounding warm air and the metal ink F. However, the blower 34 may warm the metal ink F by introducing remaining heat (waste heat) of the rubber heater H to the supply tube T.

In the second embodiment, the circulation pump VPC has the cooling mechanism, but it may be omitted. Namely, it is enough that the cooling water W is cooled merely by the heat exchanger 40. In this case, the circulation pump VPC does not include the cooling mechanism, so that the droplet discharging device 10 includes fewer components and can achieve energy-saving, namely be friendly to the environment.

Figure 12:
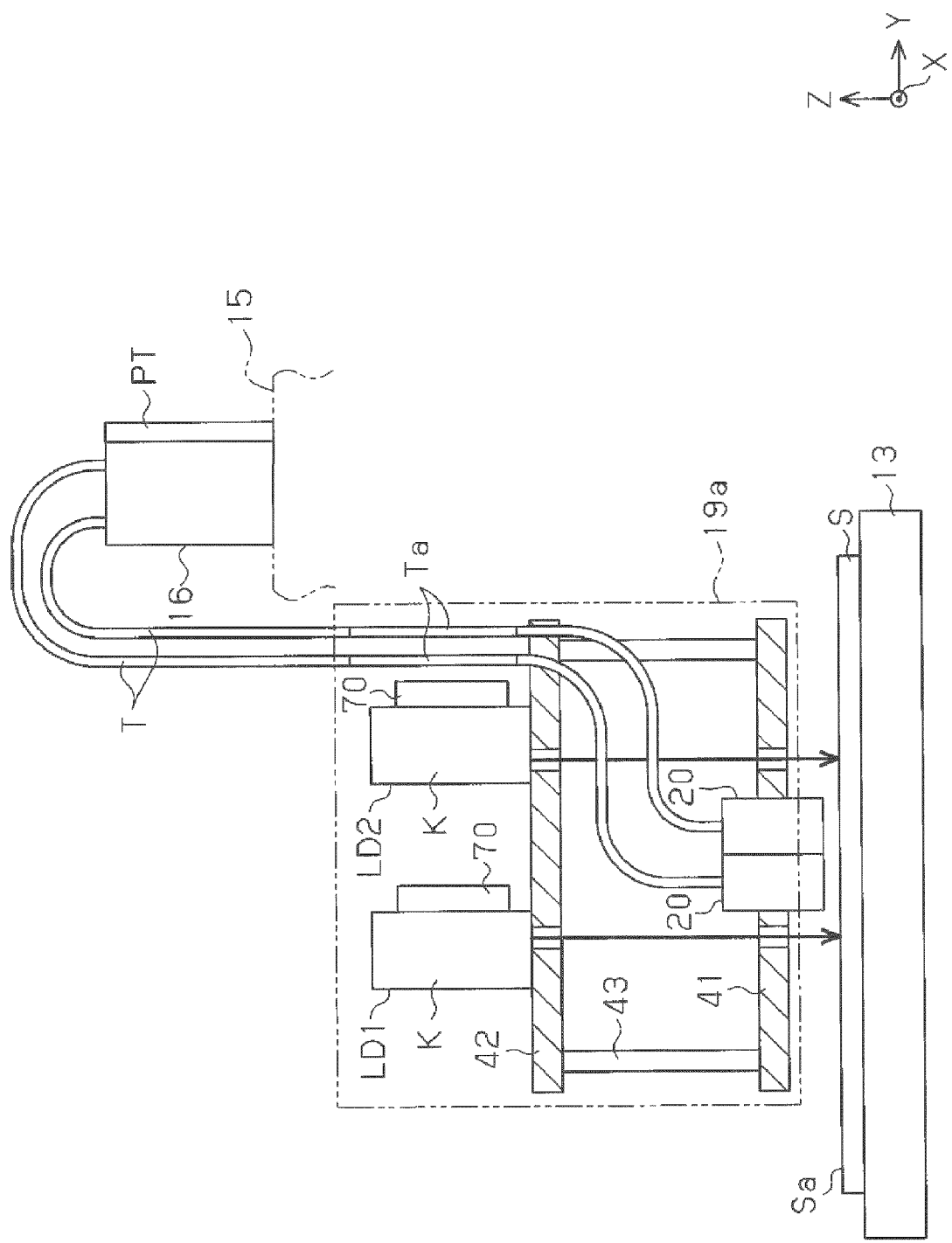
FIG. 12 is a schematic view showing a heat exchange system according to a modification of the invention.

In the second embodiment, the cooling water W circulates so as to warm the metal ink F and cool each of the semiconductor lasers LS and the circuit elements. However, as shown in FIG. 12, each of the cases K of the first semiconductor laser device LD1 and the second semiconductor laser device LD2 may include a cooling fan 70. In particular, the cooling fan 70 may exhaust warm air of the inside of the case K and introduce cool external air into the case K correspondingly to the exhaustion, thus cooling each of the semiconductor lasers LS and the circuit elements. Then the cooling fan 70 may blow the warm air (hot air) that is exhausted from the case K to the stainless pipe Ta of the supply tube T.

In such structure as well, the droplet discharging device 10 can warm the metal ink F by using waste heat from each of the semiconductor lasers LS and the circuit elements. Thus, the droplet discharging device 10 does not need any special heating means for merely heating the metal ink F, so that the droplet discharging device 10 can include fewer components and achieve energy-saving, namely be friendly to the environment.

In the second embodiment, the Peltier element PT cools the metal ink F. However, other cooling means may be used to cool the metal ink F.

In the second embodiment, the droplet discharging device 10 includes two discharge heads 20. However, the droplet discharging device 10 may include one or more than two droplet discharge heads 20.

In the second embodiment, the first semiconductor laser device LD1 and the second semiconductor laser device LD2 serve as a light source. However, LED may be used as the light source and light emitted from the LED may be used.

In the above embodiments, the suction pump VP adjusts the inner pressure of the pack storage 16. However, the pack storage 16 may include a self-sealing valve so as to adjust the inner pressure of the pack storage 16 by using it.

While the functional liquid is the metal ink F in the above embodiments, it is not limited. Any functional liquid that needs to be maintained at low temperature may be used. The temperature for maintenance may be changed appropriately depending on the functional liquid.

In the above embodiments, the droplet discharging device 10 forms the wiring pattern on the green sheet S. However, the droplet discharging device 10 may form the pattern on a substrate made of glass or the like.

In the above embodiments, the droplet discharge means is the droplet discharge head 20 of the piezoelectric element drive system. However, the droplet discharge head may be the one of a resistance heating system or of an electrostatic driving system.

What is claimed is:

1. A method for heating a functional liquid of a droplet discharging device, having: a storage that houses a container storing a functional liquid containing a functional material; a droplet discharge head discharging the functional liquid in a droplet; a cooling means included to the storage and cooling the functional liquid; and a supply tube supplying the functional liquid that is cooled in the storage to the droplet discharge head, the method comprising: heating the functional liquid in the supply tube with waste heat that is generated correspondingly to irradiation of the light source.

2. A droplet discharging device, comprising:

a storage that houses a container storing a functional liquid containing a functional material;

a droplet discharge head discharging the functional liquid in a droplet to an object;

a cooling means cooling the functional liquid that is stored in the container housed in the storage;

a supply tube provided between the container and the droplet discharge head and supplying the functional liquid stored in the container to the droplet discharge head;

a light source irradiating an area of the object on which the droplet lands with light; and a heating means heating the supply tube with waste heat that is generated correspondingly to irradiation of the light source.

3. The droplet discharging device according to claim 1, wherein the heating means includes a circulation pump and a heat exchanger;
the circulation pump allows a refrigerant to circulate between a case of the light source and the heat exchanger; and
the heat exchanger provides heat of the case to the functional liquid that is in the supply tube by heat exchange between the refrigerant and the supply tube.

4. The droplet discharging device according to claim 3, wherein the circulation pump includes a cooling mechanism and circulates the refrigerant that is cooled with the cooling mechanism to the case of the light source.

5. The droplet discharging device according to claim 1, wherein the heating means is a cooling fan that sucks external air to an inside of the case of the light source and blows inner air of the case to the supply tube that is provided outside of the case.

* * * * *